United States Patent [19]

Shikata et al.

[11] Patent Number: 5,390,401
[45] Date of Patent: Feb. 21, 1995

[54] METHOD FOR PRODUCING A SURFACE ACOUSTIC WAVE DEVICE

[75] Inventors: Shinichi Shikata; Hideaki Nakahata; Akihiro Hachigo; Naoji Fujimori, all of Hyogo, Japan

[73] Assignee: Sumitomo Electric Industries, Ltd., Osaka, Japan

[21] Appl. No.: 103,729

[22] Filed: Aug. 6, 1993

Related U.S. Application Data

[63] Continuation of Ser. No. 940,465, Sep. 4, 1992, abandoned.

[30] Foreign Application Priority Data

Sep. 27, 1991 [JP] Japan .................. 3-249747

[51] Int. Cl.⁶ ............................ H01L 41/22
[52] U.S. Cl. .................. 29/25.35; 310/313 R; 427/100
[58] Field of Search ............ 29/25.35; 427/100; 310/313 R, 313 A, 313 B, 348; 333/194–196, 153–155

[56] References Cited

U.S. PATENT DOCUMENTS

| | | | |
|---|---|---|---|
| 4,047,129 | 9/1977 | Ishiyama | 310/313 R X |
| 4,291,285 | 9/1981 | Kadota | 310/313 R X |
| 4,480,148 | 10/1984 | Archer | 310/313 R X |
| 4,628,146 | 12/1986 | Schmotz | 310/313 R X |
| 4,699,682 | 10/1987 | Takishima | 310/313 R X |
| 4,845,397 | 7/1989 | Merrick et al. | 310/313 R X |
| 4,952,832 | 8/1990 | Imai et al. | 310/313 A |
| 5,162,822 | 11/1992 | Wakamori | 310/313 R X |

FOREIGN PATENT DOCUMENTS 54-38874  11/1979  Japan .
64-62911   3/1989  Japan .

OTHER PUBLICATIONS

Saw Filters Using Zno Thin Films By D. Kirk et al. May 1988 Proc Electronic Components Conf.

*Primary Examiner*—Carl E. Hall
*Attorney, Agent, or Firm*—W. G. Fasse; W. F. Fasse

[57] ABSTRACT

A surface acoustic wave device is so manufactured that it's reliability is increased and so that it is surface-mountable with no requirement for packaging. The surface acoustic wave device (20) has a pair of opposite interdigital electrodes (2a, 2b) and a piezoelectric member (4) in close contact with the interdigital electrodes (2a, 2b). A portion located between the pair of interdigital electrodes (2a, 2b) propagates surface acoustic waves. This device (20) is characterized by an air bridge (13) covering the portion of the piezoelectric member (4) for propagating surface acoustic waves and the pair of interdigital electrodes (2a, 2b). The air bridge (13), may be provided with an insulating film (14) which is not in contact with the piezoelectric member (4).

3 Claims, 4 Drawing Sheets

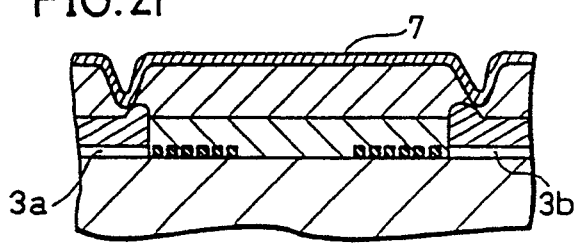
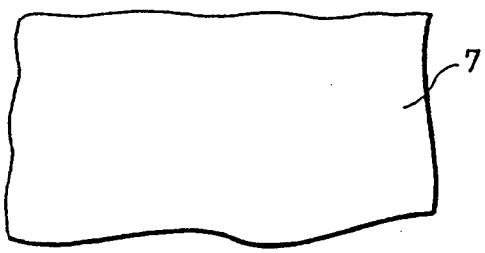
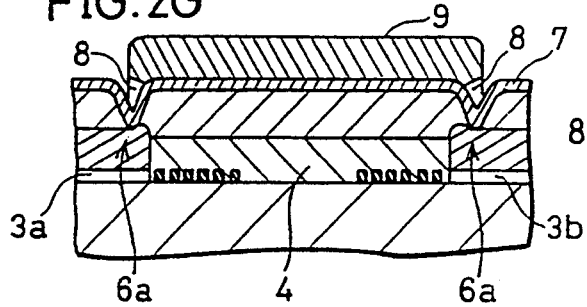
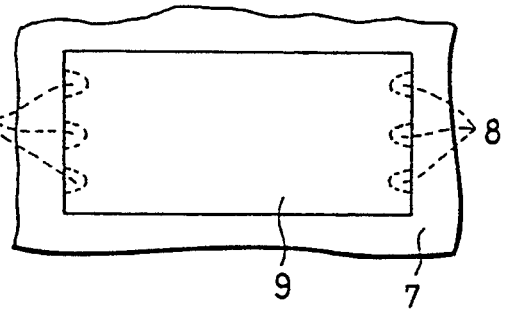
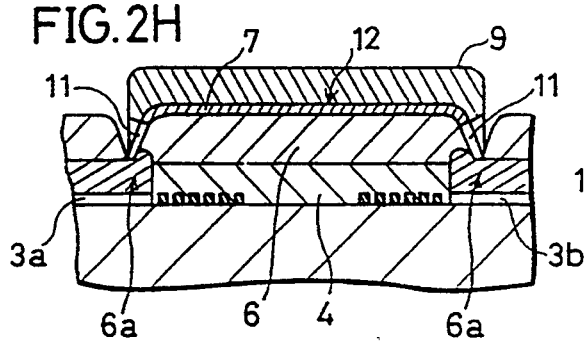
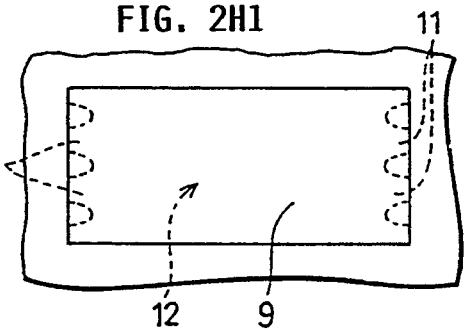
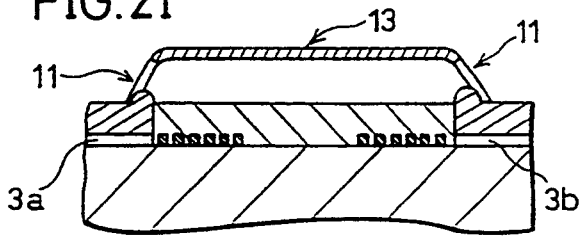
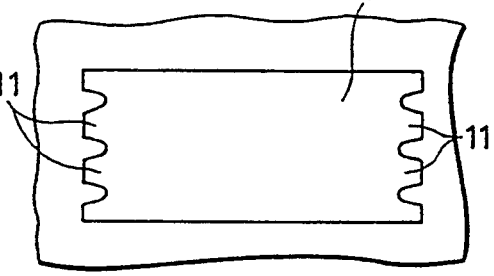
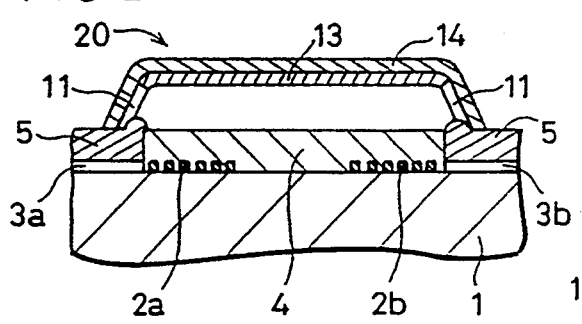
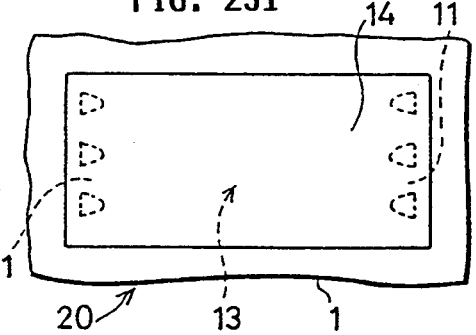

METHOD FOR PRODUCING A SURFACE ACOUSTIC WAVE DEVICE

This application is a continuation of U.S. patent application Ser. No. 940,465, filed Sep. 4, 1992, now abandoned.

FIELD OF THE INVENTION

The present invention relates to a method of producing a surface acoustic wave device, which is used as a high frequency filter or the like.

BACKGROUND INFORMATION

A surface acoustic wave device, which is an electromechanical transducer device utilizing surface waves propagated on the surface of an elastic body, has a general structure shown in FIG. 1, for example. In such a surface acoustic wave device 30, a piezoelectric phenomenon which is caused by a piezoelectric member 31 is utilized for exciting surface waves. When an electric signal is applied to interdigital electrodes 32 which are provided on the piezoelectric member 31, the piezoelectric member 31 is distorted to generate surface acoustic waves, which in turn are propagated along the piezoelectric member 31 and received in other interdigital electrodes 33 as an electric signal. The term "interdigital" as used herein means that the electrodes have finger-like electrode elements which are positioned to intermesh as shown in FIG. 1. Assuming that $\lambda_0$ represents the electrode period in the interdigital electrodes 32 and 33 and v represents the velocity of the surface acoustic waves in relation to frequency characteristics, this device has a bandpass characteristic with a center frequency $f_0$, which is expressed as $f_0 = v/\lambda_0$.

The surface acoustic wave device can be miniaturized with a small number of components, while it is possible to input/output signals on a surface wave propagation path. This device can be used as a filter, a delay line, an oscillator, a resonator, a convolver, a correlator etc. In particular, a surface acoustic wave filter has been practically used as an intermediate frequency filter for television over a long time, while the same is now being used as filters for VTR and various communication devices such as a portable telephone and a car telephone.

In relation to the aforementioned surface acoustic wave device, a device useful in a higher frequency range of 1.5 to 3 GHz with regard to official frequency allocations is desirable as a surface acoustic wave filter for use in the field of mobile communication, for example. As understood from the above expression, such a device has a frequency characteristics with higher center frequency $f_0$ if the electrode period $\lambda_0$ is reduced or the velocity v of the surface waves is increased.

Japanese Patent Publication No. 54-38874 (1979) discloses a surface acoustic wave device which comprises a substrate, a piezoelectric thin film and an insulating layer, made of a material (e.g., sapphire) having a larger surface acoustic wave propagation velocity than that in the piezoelectric thin film, provided between the substrate and the piezoelectric thin film. On the other hand, Japanese Patent Laying-Open No. 64-62911 (1989) in the name of the assignee of the present application discloses a surface acoustic wave device comprising a piezoelectric member which is stacked on a diamond layer for increasing the velocity v of surface acoustic waves. Diamond has the largest sound velocity among materials, and the same is physically and chemically stable.

Each of the aforementioned surface acoustic wave devices has been generally stored in a package, with no passivation of its center portion which is defined by a pair of interdigital electrodes and a piezoelectric member. This is because the characteristics of the device, particularly the frequency characteristics, are inevitably changed if an insulating film for passivation is provided on the piezoelectric member for propagating surface acoustic waves. However, a device packaged without any passivation cannot be sufficiently guaranteed in reliability. When such a non-protected surface acoustic wave device is surface-mounted on an electronic device to be connected to a peripheral circuit such as an amplifying circuit, it is necessary to package the device to avoid damage to the piezoelectric member and to the interdigital electrodes. In practice, however, it has been impossible to carry out such packaging, due to the uncertain reliability of the surface acoustic wave device whose surface is not passivated.

SUMMARY OF THE INVENTION

An object of the present invention is to solve the aforementioned problems and provide a method for producing a surface acoustic wave device which is has a sufficient reliability that can be guaranteed with no necessity for packaging in a surface mounting.

Provided according to the present invention is a surface acoustic wave device which comprises a pair of interdigital electrodes and a piezoelectric member positioned in close contact with the interdigital electrodes and at least having a portion for propagating surface acoustic waves between the pair of interdigital electrodes. This device is provided with an air bridge which at least covers the pair of interdigital electrodes and the portion of the piezoelectric member for propagating surface acoustic waves.

According to the present invention, the piezoelectric member can be mainly made of one or more compounds selected from a group of ZnO, AlN, Pb(Zr,Ti)O$_3$, (Pb,La)(Zr,Ti)O$_3$, LiTaO$_3$, LiNbO$_3$, SiO$_2$, Ta$_2$O$_5$, Nb$_2$O$_5$, BeO, Li$_2$B$_4$O$_7$, KNbO$_3$, ZnS, ZnSe and CdS. While the piezoelectric member can be made of either a single-crystalline or polycrystalline material, a polycrystalline material is preferably employed in order to use the device in a higher frequency range, due to small scattering of surface waves. As to the aforementioned materials, a piezoelectric member of ZnO, AlO or Pb(Zr,Ti)O$_3$ can be formed by CVD or sputtering.

In order to drive the device according to the present invention in a higher frequency range, a material, such as single-or poly-crystalline diamond, diamond-like carbon, boron nitride or sapphire, for example, having a higher acoustic wave propagation velocity than the piezoelectric member may be brought into close contact with the piezoelectric member.

In order to improve the reliability of the device according to the present invention, further, an insulating film may be provided on the air bridge. Such an insulating film may be made of an SiO$_2$ film, a PSG film, an Si$_3$N$_4$ film or a synthetic resin film of polyimide or the like, for example. As to such films, an SiO$_2$ film and a PSG film can be grown by low-temperature CVD, for example, while an Si$_3$N$_4$ film can be formed by plasma deposition, for example.

In the surface acoustic wave device according to the present invention, the portion of the piezoelectric member for propagating surface acoustic waves and the pair of interdigital electrodes are covered with the air bridge. In other words, a center portion of the device, which is defined by the pair of interdigital electrodes and the piezoelectric member for electromechanical transduction, is protected by the air bridge. Further, material necessary for passivation does not come into contact with the pair of interdigital electrodes and the portion located therebetween for propagating surface acoustic waves. Due to the structure for passivation which leaves the center portion untouched, it is possible to passivate the device without changing its characteristics.

In the device according to the present invention, further, the air bridge of a conductive material such as a metal may be grounded so that it is possible to suppress the generation of direct waves between the pair of the interdigital electrodes.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2A to 2J1 typically illustrate steps of manufacturing a surface acoustic wave device according to the present invention.

DESCRIPTION OF THE PREFERRED EMBODIMENTS

Figure 1:
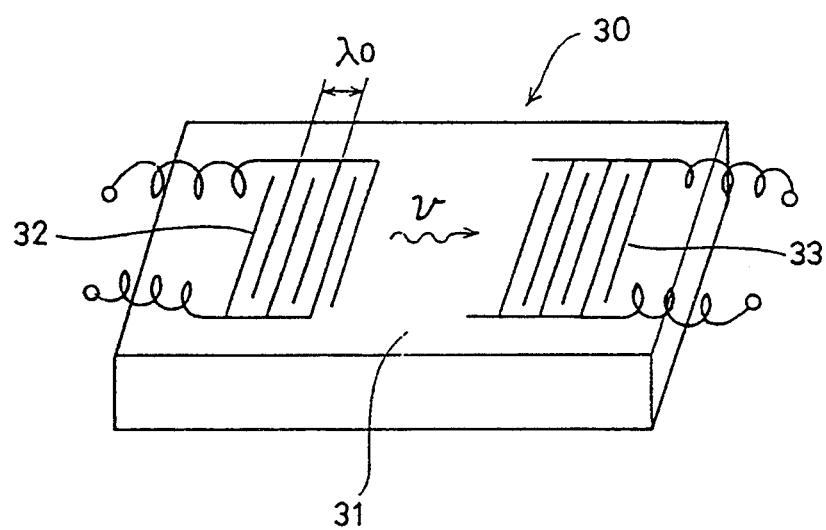
FIG. 1 s a perspective view for illustrating the general structure of a surface acoustic wave device.

A high frequency filter according to the present invention has been manufactured in practice. The manufacturing method is now described with reference to the drawings. Referring to the drawings, sectional views are shown in FIGS. 2A to 2J while respective plan views are shown in FIGS. 2A1 to 2J1.

Figure 2A:
Figure 2A:
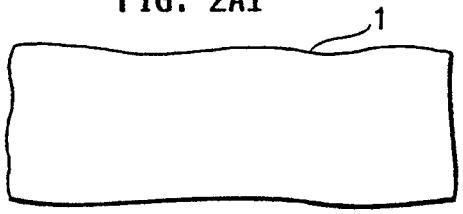
Figure 2B:
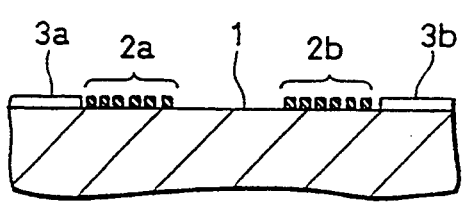
Figure 2B:
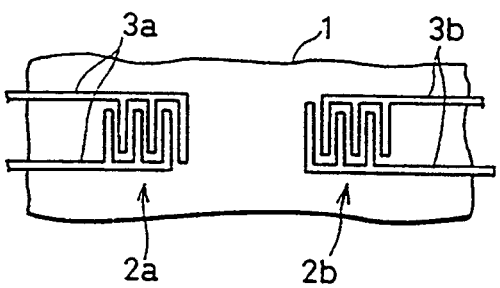

Referring to FIG. 2A, a substrate 1 of single-crystalline diamond was first prepared. An Al film was deposited on the substrate 1 by resistance heating in a thickness of 500 Å, and patterned by photolithography, to form a pair of interdigital electrodes 2a and 2b and a pair of leading electrodes 3a and 3b (FIGS. 2B and 2B1).

Figure 2C:
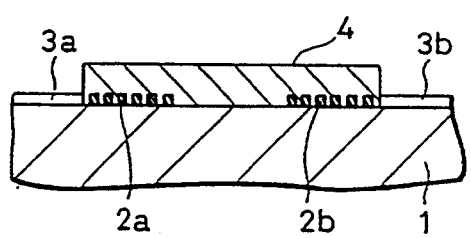
Figure 2C:
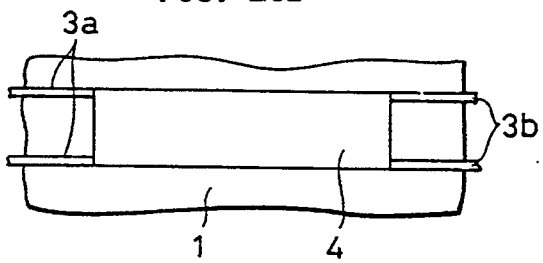
Figure 2D:
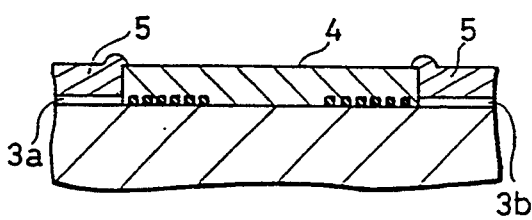
Figure 2D:
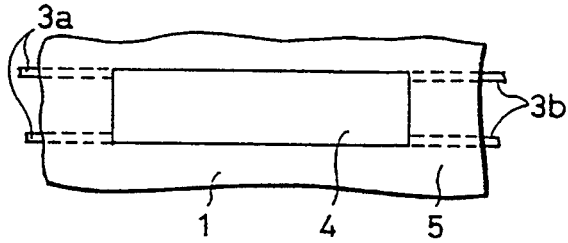

Then, the substrate 1 was placed in a magnetron sputtering apparatus and regions other than those provided with the interdigital electrodes 2a and 2b were masked, so that a ZnO polycrystalline substance was sputtered by magnetron sputtering with a mixed gas of Ar:$O_2$=1:1 under the conditions that a sputtering output was 100 W and a substrate temperature was 380° C., thereby depositing a ZnO piezoelectric layer 4 on the substrate 1 (FIGS. 2C and 2C1). Then the piezoelectric layer 4 was masked to deposit an insulating film 5 of $SiO_2$ by $SiH_4$—$N_2O$ based ECR (electron cyclotron resonance)-CVD, to protect the lead electrodes 3a and 3b (FIGS. 2D and 2D1).

Figure 2E:
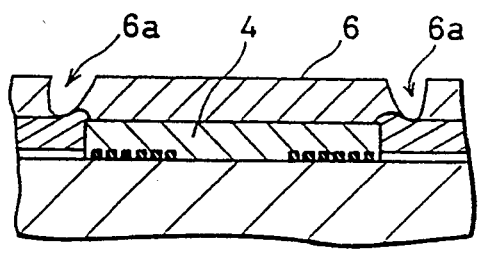
Figure 2E:
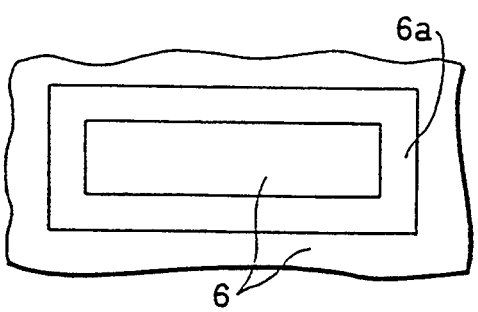

Then, a resist film was deposited on the substrate 1, and a first resist pattern 6 having a ring-shaped groove 6a was formed around the piezoelectric layer 4 (FIGS. 2E and 2E1). Then, an Au layer 7 was formed by magnetron sputtering (FIGS. 2F and 2F1). Thereafter a portion of the Au layer 7 located on the piezoelectric layer 4 and the groove 6a was covered by photolithography, to form a second resist pattern 9 having a plurality of holes 8 on the groove 6a (FIGS. 2G and 2G1). Then, the Au layer 7 was etched by ion milling, to form an Au layer pattern 12 entirely covering a portion above the piezoelectric layer 4 and having a plurality of bridging portions or elements 11 upwardly extending from the groove 6a (FIGS. 2H and 2H1). Thereafter the first and second resist patterns 6 and 9 were removed by an organic solvent, to obtain an air bridge 13 supported by the plurality of bridging portions or elements 11 (FIGS. 2I and 2I1).

Figure 3:
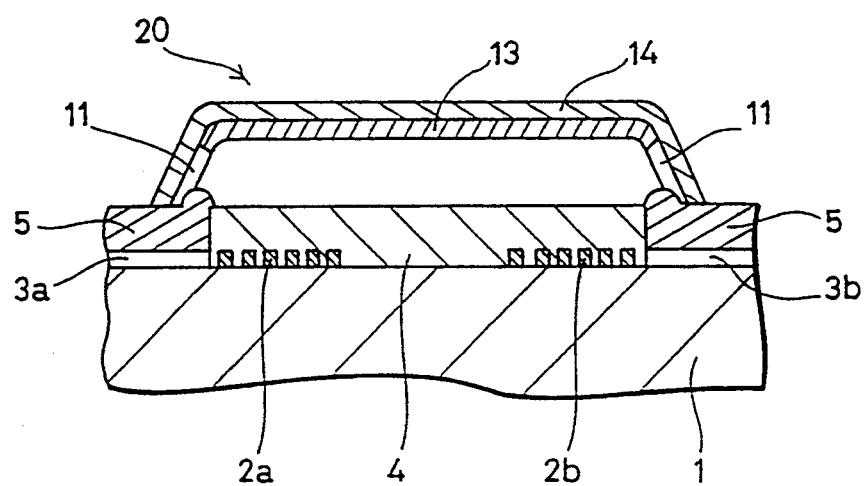
FIG. 3 is a sectional view showing a surface acoustic wave device manufactured according to an example of the present invention.

Then, an insulating film 14 of $SiO_2$ was deposited by $SiH_4$—$N_2O$ based plasma CVD, to passivate the substance. Thus obtained was a surface acoustic wave filter 20 comprising the diamond substrate 11 and the interdigital electrodes 2a and 2b as well as the piezoelectric layer 4 deposited thereon, which are covered with the insulating film 14 by the air bridge 13, as shown in FIGS. 2J and 2J1). FIG. 3 is an enlarged sectional view showing the present filter 20. Since the insulating film 14 was deposited under decompression, the interior of the air bridge 13 is maintained in a state close to a vacuum. In such a surface acoustic wave filter 20, clearances between the air bridge portions or elements 11 are filled up with the insulating film 14. However, the insulating film 14 thus partially penetrating into the interior of the air bridge 13 through the clearances between the bridge portions or elements 11 will not reach the portion for propagating surface acoustic waves, since the same is sufficiently separated from the piezoelectric layer 4. Due to this structure, it is possible to obtain a surface acoustic wave filter passivated with an insulating film which is not in contact with the portion for propagating surface acoustic waves, i.e., with no changes of characteristics of the device. When the insulating film is formed by a method having a stronger directivity such as ECR-CVD, for example, it is possible to further reduce the amount of the insulating film penetrating through the air bridge portions or elements 11.

When the aforementioned surface acoustic wave filter was held in an environment at a temperature of 80° C. and a relative humidity of 85%, no deterioration of characteristics was recognized. When a conventional surface acoustic wave filter obtained by depositing a ZnO piezoelectric layer in the aforementioned process was held under similar environment, on the other hand, its characteristics were deteriorated in one hour. Thus, it has been recognized that the reliability of the present surface acoustic wave device produced by the present method can be maintained also under severe environmental conditions.

Although the substrate was made of diamond in the aforementioned Example, a diamond layer may be formed on a substrate of a proper material such as Si, for example, so that the interdigital electrodes and the piezoelectric layer are deposited on the diamond layer.

As hereinabove described, the present device is passivated with no change in its characteristics, whereby a higher reliability is guaranteed upon packaging as compared with the prior art. Further, the present device is surface-mountable due to the passivation, to be applicable to a further miniaturized communication device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a surface acoustic wave device, comprising the following steps:
   (a) forming at least two pairs of interdigital electrodes (2a, 2b) and respective lead-in electrodes (3a, 3b) on a surface of a substrate,
   (b) forming a first masking on said substrate outside said electrodes,
   (c) forming a piezoelectric layer (4) on said electrodes,
   (d) forming a second masking on said piezoelectric layer (4),
   (e) forming an insulating film (5) outside said second masking where there is no piezoelectric layer (4),
   (f) forming a first photo-resist film (6) on said surface of said substrate to cover all areas of said surface of said substrate,
   (g) forming a groove (6a) in said photo-resist film (6) radially outwardly of said piezoelectric layer (4) to leave a photo-resist portion surrounded by said groove (6a) and a photo-resist portion outside said groove (6a),
   (h) forming a gold layer (7) on said portions of said photo-resist film (6) and on a wall of said groove,
   (i) forming a second photo-resist film (9) on said gold layer (7) above said surrounded photo-resist portion and at least partly above said groove (6a), said second photo-resist film (9) having lateral holes (8) therein,
   (j) etching said gold layer (7) to form a gold bridge pattern (12) covering said surrounded photo-resist portion and having a plurality of bridging elements (11) outside said holes (8) in said second photo-resist film (9),
   (k) removing said photo-resist films (6) and (9) through holes between neighboring bridging elements (11), whereby said gold bridge pattern (12) with its bridging elements (11) forms a gold air bridge (13) supported by said bridging elements (11) above said piezoelectric layer (4), and
   (l) depositing an insulating layer (14) on said gold air bridge (13).

2. The method according to claim 1, wherein said piezoelectric layer is essentially composed of one or more compounds selected from the group consisting of ZnO, AlN, Pb(Zr,Ti)O$_3$, (Pb,La)(Zr,Ti)O$_3$, LiTaO$_3$, LiNbO$_3$, SiO$_2$, Ta$_2$O$_5$, Nb$_2$O$_5$, BeO, Li$_2$O$_4$O$_7$, KNbO$_3$, ZnS, ZnSe and CdS.

3. The method according to claim 1, wherein said substrate is made of any material selected from the group consisting of diamond, diamond-like carbon, boron nitride and sapphire.

* * * * *